US009632430B2

(12) United States Patent
Mos et al.

(10) Patent No.: US 9,632,430 B2
(45) Date of Patent: Apr. 25, 2017

(54) LITHOGRAPHIC SYSTEM, LITHOGRAPHIC METHOD AND DEVICE MANUFACTURING METHOD

(75) Inventors: Everhardus Cornelis Mos, Best (NL); Maurits Van Der Schaar, Eindhoven (NL); Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 1399 days.

(21) Appl. No.: 13/120,495

(22) PCT Filed: Sep. 17, 2009

(86) PCT No.: PCT/EP2009/006715
§ 371 (c)(1),
(2), (4) Date: Aug. 26, 2011

(87) PCT Pub. No.: WO2010/034427
PCT Pub. Date: Apr. 1, 2010

(65) Prior Publication Data
US 2011/0299050 A1   Dec. 8, 2011

Related U.S. Application Data

(60) Provisional application No. 61/099,311, filed on Sep. 23, 2008.

(51) Int. Cl.
*G03B 27/52* (2006.01)
*G03F 7/20* (2006.01)

(52) U.S. Cl.
CPC ...... *G03F 7/70625* (2013.01); *G03F 7/70525* (2013.01)

(58) Field of Classification Search
CPC .................. G03F 7/70525; G03F 7/70625
(Continued)

(56) References Cited

U.S. PATENT DOCUMENTS 4,621,890 A * 11/1986 Suzuki ............... G02B 27/09
359/744
5,194,744 A * 3/1993 Aoki ..................... G03F 9/7065
250/548
(Continued)

FOREIGN PATENT DOCUMENTS

EP   1628164        2/2006
EP   1927893        6/2008
EP   2 020 621 A1   2/2009

OTHER PUBLICATIONS

International Search Report directed to related International Application No. PCT/EP2009/006715, the International Searching Authority, Rijswijk, Netherlands, mailed Feb. 9, 2011; 5 pages.
(Continued)

*Primary Examiner* — Deoram Persaud
(74) *Attorney, Agent, or Firm* — Sterne, Kessler, Goldstein & Fox P.L.L.C.

(57) ABSTRACT

A lithographic system includes a lithographic apparatus and a scatterometer. In an embodiment, the lithographic apparatus includes an illumination optical system arranged to illuminate a pattern and a projection optical system arranged to project an image of the pattern on to a substrate. In an embodiment, the scatterometer includes a measurement system arranged to direct a beam of radiation onto a target pattern on said substrate and to obtain an image of a pupil plane representative of radiation scattered from the target pattern. A computational arrangement represents the pupil plane by moment functions calculated from a pair of orthogonal basis function and correlates the moment function to lithographic feature parameters to build a lithographic system identification. A control arrangement uses the system identification to control subsequent lithographic processes performed by the lithographic apparatus.

23 Claims, 6 Drawing Sheets

(58) Field of Classification Search
USPC .......................................... 355/53, 52, 55, 77
See application file for complete search history.

(56) References Cited

U.S. PATENT DOCUMENTS

| | | | | |
|---|---|---|---|---|
| 6,285,971 | B1* | 9/2001 | Shah ...................... | G05B 13/04 700/38 |
| 6,721,691 | B2* | 4/2004 | Bao ...................... | G01N 21/956 356/369 |
| 6,725,098 | B2* | 4/2004 | Edwards .............. | G05B 13/042 257/E21.525 |
| 6,738,677 | B2* | 5/2004 | Martin .................. | G05B 17/02 700/27 |
| 6,890,773 | B1 | 5/2005 | Stewart | |
| 7,221,989 | B2* | 5/2007 | Prager ................... | G01B 11/24 438/16 |
| 7,460,237 | B1 | 12/2008 | Cramer | |
| 7,557,921 | B1* | 7/2009 | Adel et al. .................... | 356/401 |
| 7,738,103 | B2* | 6/2010 | Kiers ..................... | G01N 21/47 356/237.3 |
| 8,014,004 | B2* | 9/2011 | Ravid .............. | G01B 11/0625 356/630 |
| 8,730,465 | B2* | 5/2014 | Endo .................... | G01N 21/956 356/237.4 |
| 2003/0103189 | A1 | 6/2003 | Neureuther et al. | |
| 2003/0143761 | A1* | 7/2003 | Fukuda ................ | H01L 23/544 438/7 |
| 2004/0167655 | A1* | 8/2004 | Middlebrooks ...... | G05B 13/048 700/121 |
| 2004/0233440 | A1* | 11/2004 | Mieher ................ | G01N 21/956 356/401 |
| 2005/0083243 | A1* | 4/2005 | Middlebrooks ......... | G03F 7/705 343/797 |
| 2005/0185174 | A1* | 8/2005 | Van Der Laan .... | G03F 7/70683 356/243.1 |
| 2005/0187643 | A1* | 8/2005 | Sayyar-Rodsari ... | G05B 13/042 700/29 |
| 2005/0209714 | A1* | 9/2005 | Rawlings ............. | G05B 13/048 700/29 |
| 2007/0222979 | A1* | 9/2007 | Van Der Laan .... | G03F 7/70683 356/243.1 |
| 2008/0043239 | A1 | 2/2008 | Boef et al. | |
| 2008/0088832 | A1* | 4/2008 | Cramer et al. ............. | 356/237.4 |
| 2008/0281438 | A1* | 11/2008 | Middlebrooks ...... | G05B 13/041 700/29 |
| 2015/0003722 | A1* | 1/2015 | Otani ................ | G02B 21/0004 382/149 |

OTHER PUBLICATIONS

International Preliminary Report on Patentability and Written Opinion directed to related International Application No. PCT/EP2009/006715, The International Bureau of WIPO, Geneva, Switzerland, issued Mar. 29, 2011; 6 pages.

Teague, Michael R., "Image analysts via the general theory of moments," Journal of the Optical Society of America, vol. 70, No. 8, Aug. 1980; pp. 920-930.

\* cited by examiner

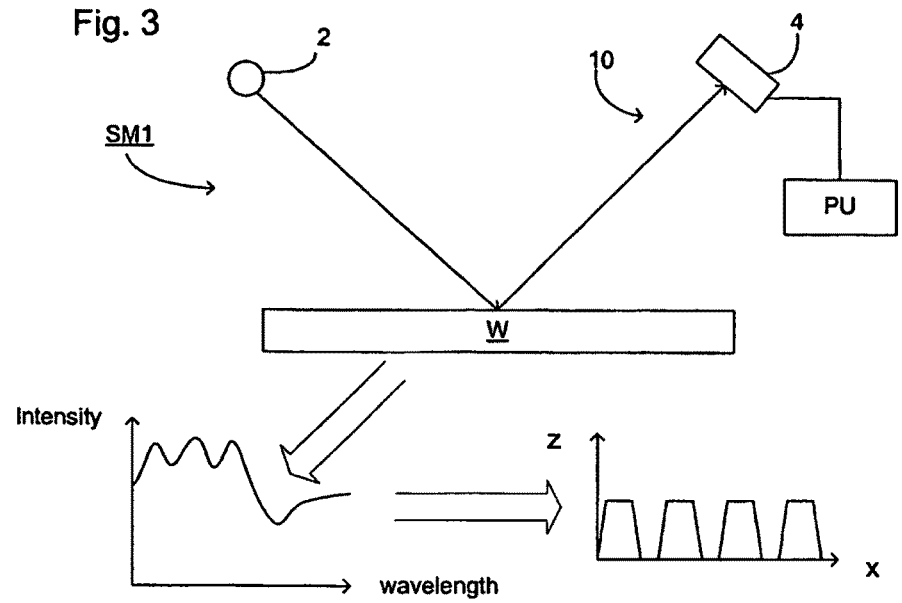
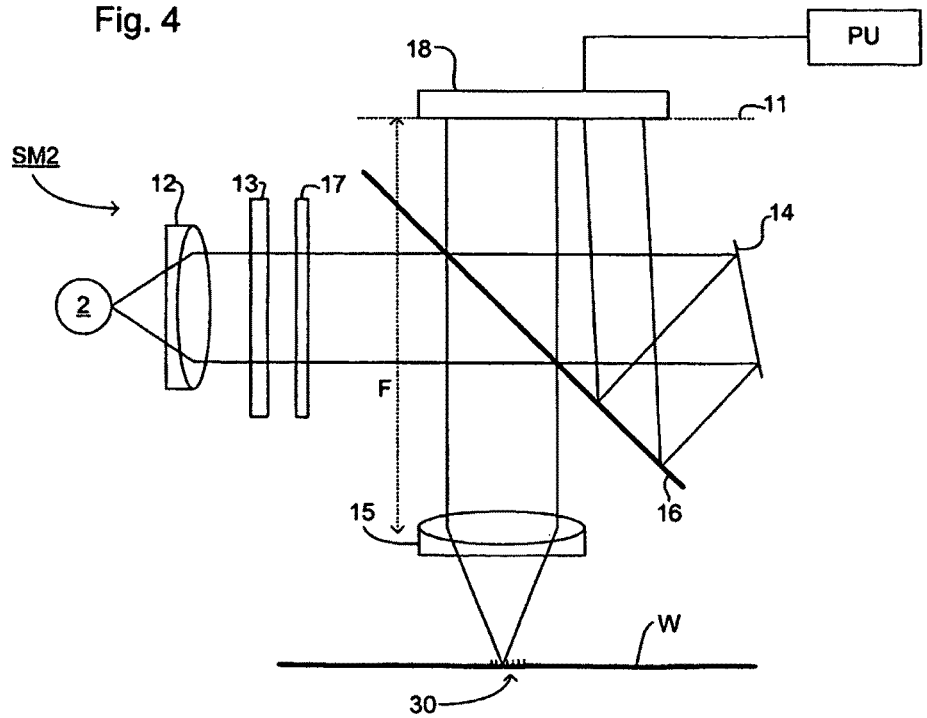

LITHOGRAPHIC SYSTEM, LITHOGRAPHIC METHOD AND DEVICE MANUFACTURING METHOD

CROSS-REFERENCE TO RELATED APPLICATIONS

This application claims the benefit of U.S. provisional application 61/099,311, which was filed on Sep. 23, 2008, and which is incorporated herein in its entirety by reference.

FIELD

Embodiments of the present invention relate to lithographic systems and methods usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The output of the scatterometer may be used to monitor the operation of a lithographic apparatus online. This is done by monitoring the values of one or more parameters of the target and adjusting the lithographic apparatus parameters accordingly in order to take any necessary corrective actions. However in order to determine the parameters of the substrate, the best match must be found between a theoretical spectrum produced from a model of the substrate and the measured spectrum produced by the reflected beam as a function of either wavelength (spectroscopic scatterometers) or angle (angularly resolved scatterometers). In either case it is necessary to have sufficient data points (wavelengths and/or angles) in the calculated spectrum in order to enable an accurate match, typically between 80 to 800 data points or more be necessary for each spectrum. In practice this leads to a compromise between accuracy and speed of processing.

In our co-pending application EP 1927893, incorporated herein by reference in its entirety, there is disclosed a method of monitoring the pupil plane, that is the back focal plane of a scatterometer, in order to detect process excursions. In the method disclosed, a fault indicator is used to notify a user by an alarm if the scatterometer image indicates any changes in the lithographic process.

In known scatterometers it is known to mathematically to model the pupil image using a rigorous coupled wave analysis (RCWA) algorithm, which is based on Maxwell's equations. Basically the parameters that describe a structure on the target, such as thickness, indices of refraction, etc., are inferred by minimizing the difference between the measured pupil plane image and the predicted pupil plane image. However, this method is very calculation intensive as the models are non-linear. Thus there is no guarantee of convergence or a unique solution being obtained. The method involves approximations being made, such as constraining some of the parameters to values that may not even be physically possible.

BRIEF SUMMARY

The inventors have discovered a lithographic process in which the parameters are monitored by monitoring the pupil image in a scatterometry process, wherein the comparison of the measured spectra with a calculated spectrum may be carried out more efficiently without a corresponding reduction in accuracy.

According to a first aspect of the invention, there is provided a method of using a lithography system. The method may include obtaining a representation of a pupil plane representative of radiation scattered from a target on a substrate, representing the representation of the pupil plane by a moment function calculated from at least one orthogonal basis function, correlating the moment function to at least one lithographic feature parameter to build a lithographic system identification, and using the system identification to control a lithographic process.

According to a second aspect of the invention there is provided a lithographic system. The system may include a lithographic apparatus, an inspection apparatus and a control arrangement. The lithographic apparatus may include an illumination optical system arranged to illuminate a pattern and a projection optical system arranged to project an image of the pattern on to a substrate. The inspection apparatus may include a measurement system arranged to obtain a representation of a pupil plane representative of radiation scattered from the pattern and a computational arrangement adapted to represent the pupil plane by a moment function calculated from at least one orthogonal basis function and to correlate the moment function to at least one lithographic feature parameter to build a lithographic system identification. The control arrangement may be adapted to use the system identification to control a lithographic process performed by the lithographic apparatus.

According to a third aspect of the invention there is provided an inspection apparatus. The inspection apparatus may include a measurement system arranged to direct a beam of radiation onto a target pattern on a substrate and to obtain a representation of a pupil plane representative of radiation scattered from the target pattern, and a computational arrangement adapted to represent the pupil plane by a moment function calculated from at least one orthogonal basis function and to correlate the moment function to at least one lithographic feature parameter to build a lithographic system identification.

According to a fourth aspect of the invention there is provided a lithographic cell. The lithographic cell may include a coater arranged to coat substrates with a radiation sensitive layer, a lithographic apparatus arranged to expose images onto the radiation sensitive layer of substrates coated by the coater, a developer arranged to develop images exposed by the lithographic apparatus, and an inspection apparatus. The inspection apparatus may include a measurement system arranged to direct a beam of radiation onto a target pattern on a substrate and to obtain a representation of a pupil plane representative of radiation scattered from the pattern, a computational arrangement adapted to represent the pupil plane by a moment function calculated from at least one orthogonal basis function and to correlate the moment function to at least one lithographic feature parameter to build a lithographic system identification, and a control arrangement adapted to use the system identification to control a lithographic process performed by said lithographic apparatus.

According to a fifth aspect of the invention there is provided a device manufacturing method device manufacturing method. The method may include using a lithographic apparatus to form a pattern on a substrate, obtaining a representation of a pupil plane representative of radiation scattered from the pattern, representing the pupil plane by a moment function calculated from at least one orthogonal basis function, correlating the moment function to at least one lithographic feature parameter to build a lithographic system identification, and using the system identification to control a lithographic process performed by the lithographic apparatus.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIG. 3 depicts a first scatterometer that may be used in an embodiment of the invention.

FIG. 4 depicts a second scatterometer that may be used in an embodiment of the invention.

DETAILED DESCRIPTION

Figure 1:
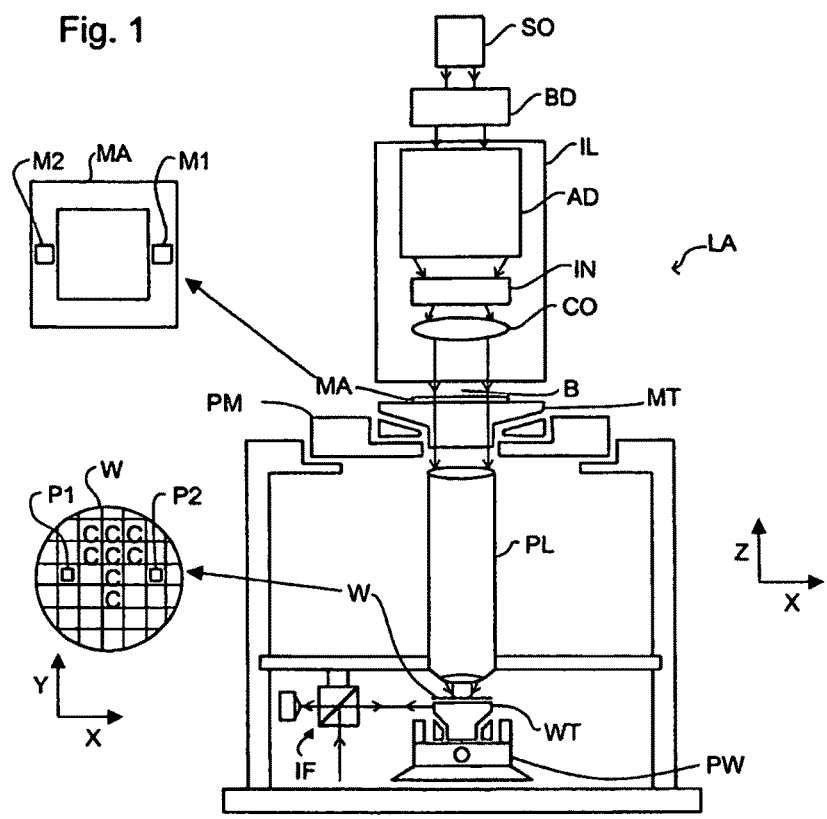
FIG. 1 depicts a lithographic apparatus.

FIG. 1 schematically depicts a lithographic apparatus. The apparatus includes:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to radiation beam B by patterning device MA onto a target portion C (e.g. comprising one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may comprise various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PL, which focuses the beam onto a target portion C of substrate W. With the aid of second positioner PW and position sensor IF (e.g. an interferometric device, linear encoder, 2-D encoder or capacitive sensor), substrate table WT can be moved accurately, e.g. so as to position different target portions C in the path of radiation beam B. Similarly, first positioner PM and another position sensor (which is not explicitly depicted in FIG. 1) can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-) magnification and image reversal characteristics of projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
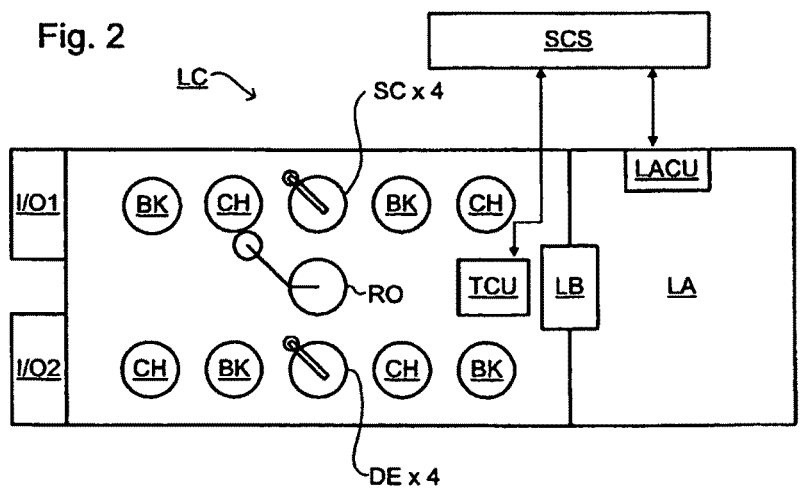
FIG. 2 depicts a lithographic cell or cluster.

As shown in FIG. 2, lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to loading bay LB of the lithographic apparatus. These devices, which are often collectively referred to as the track, are under the control of a track control unit TCU which is itself controlled by supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions that are good.

An inspection apparatus is used to determine the properties of the substrates, and in particular, how the properties of different substrates or different layers of the same substrate vary from layer to layer. The inspection apparatus may be integrated into lithographic apparatus LA or lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist, which have been exposed to radiation, and those that have not—and not all inspection apparatus have sufficient sensitivity to make useful measurements of the latent image. Therefore measurements may be taken after the post-exposure bake step (PEB), which is customarily the first step, carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer, which may be used in embodiments of the present invention. It comprises a broadband (white light) radiation projector 2, which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with embodiments of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in back-projected pupil plane 11, which is at the focal length of lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. Detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating may be used instead of interference filters.

Detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, incorporated herein by reference in its entirety.

Target 30 on substrate W may be a grating, which is printed such that after development, the bars are formed of solid resist lines. The bars may alternatively be etched into the substrate. This pattern is sensitive to chromatic aberrations in the lithographic projection apparatus, particularly projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5:
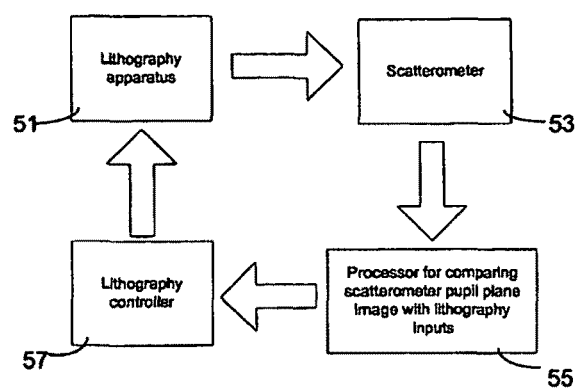
FIG. 5 depicts an overview of a lithographic system in accordance with an embodiment of the invention.

Referring now to FIG. 5, this figure illustrates a lithography system in accordance with an embodiment of the invention. The lithography system includes a lithographic apparatus 51, a scatterometer 53, a processor 55 and a lithography controller 57. Lithography controller 57 controls the actuator settings for lithography apparatus 51, such as focus, dose, numerical aperture, sigma and overlay, dependent on measurements made by scatterometer 53 on wafers produced by lithography apparatus 51. In accordance with an embodiment of the invention, the relation between the actuator settings for lithographic apparatus 51 and moment functions representing a pupil plane image measured by scatterometer 53 is determined. The moment functions are used to represent the pupil plane image, reducing the amount of computation needed by processor 55 to compare the measured pupil plane image with a modeled representation of the pupil plane based on the actuator settings.

Figure 6:
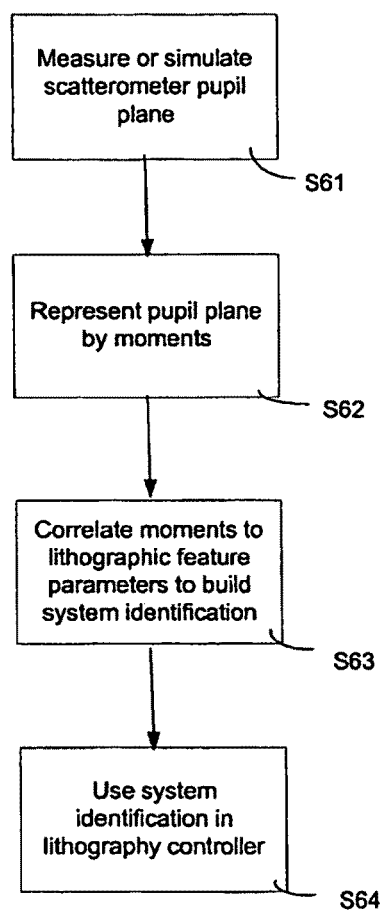
FIG. 6 is a flow chart showing the steps used in a lithography process according to an embodiment of the invention.

Referring now also to FIG. 6, this figure illustrates the process steps of a process in accordance with an embodiment of the invention.

In step S61, a scatterometer, such as scatterometer 53, is used to measure a series of pupil plane images produced from wafers each carrying a defined product reticle, which has been produced by the lithography apparatus whilst varying the relevant lithographic actuator settings. It will be appreciated that the product reticles may be part of the product itself or separate target reticles.

In step S62, the series of pupil plane images produced in step S63 are used to produce the coefficients of a moment function derived from an orthogonal basis function, for example Zernike, discrete Chebyshev, radial Chebyshev and Legendre polynomials.

In step S63, standard system identification techniques are used to produce a system identification by correlating the moments to the corresponding lithographic actuator settings. Additionally or alternatively, the moments may be correlated to predicted product features, such as HotSpots—that is, points on the chip which are difficult to produce, such as points between a pair of gates. Furthermore, additionally or alternatively, the moments may be correlated to measurements of product features obtained by other techniques, for example with a scanning electron microscope (SEM).

Referring now to step S64, once the system identification has been established, it can be used by a lithography controller, for example lithography controller 57, to maintain optimal lithographic process performance, by driving the actuator settings to produce the desired product features. This can be achieved by use of a model predictive control system as will be described hereafter.

Figure 8:
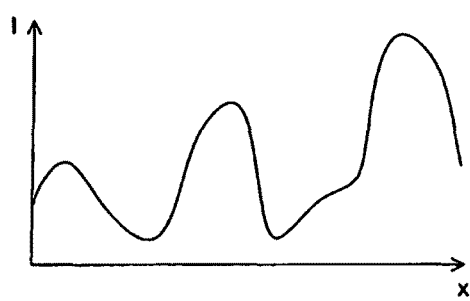
FIG. 8 depicts an exemplary plot of the intensity against the pixels in one row of the image shown in FIG. 7.
Figure 7:
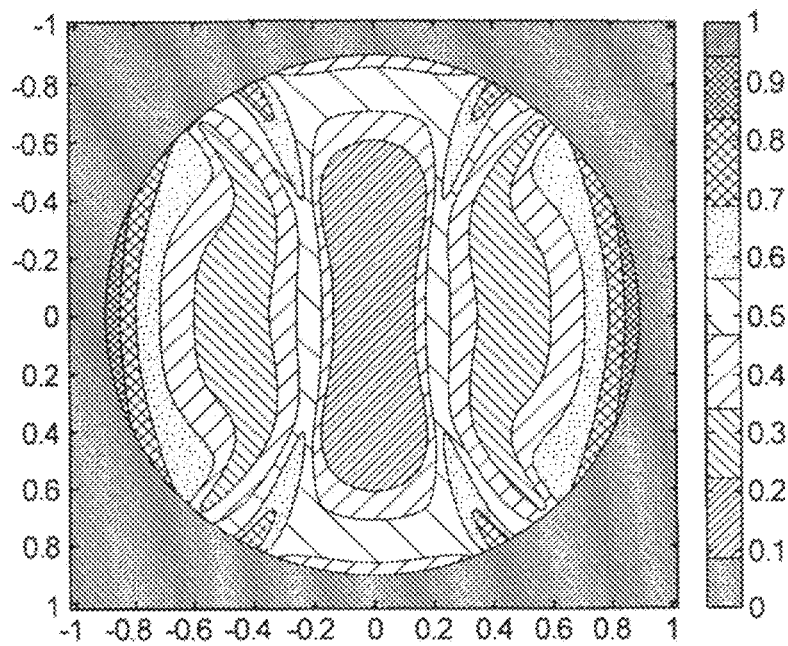
FIG. 7 depicts an exemplary image of a pupil plane which is obtained by the scatterometer in the system of FIG. 5.

FIG. 7 shows a typical pupil image measured by the scatterometer in step S61. This image contains 1,000×1,000 pixels. In order to derive the coefficients of the moment functions, the image is scanned so as to produce, for each row of the image, a plot of the image intensity for each pixel as shown in FIG. 8. Corresponding plots can be obtained for each column that is the intensity of the pixel against the Y direction. Each intensity plot can be fitted to a polynomial $P_n(x)$ and $P_m(y)$ such that the moment function $M_{mn}$ can be defined as $$M_{mn} = \iint_{mn} P_n(x)P_m(y)F(x,y)dxdy$$

where $F(x,y)$ corresponds to the image of the pupil plane shown in FIG. 7, $P_n(x)$ and $P_m(y)$ are moment functions derived from the orthogonal basis functions, for example Zernike, discrete Chebyshev, radial Chebyshev and Legendre polynomials, and n and m are the orders of the respective basis functions. Further details of such processing can be found, for example, in the article by Michael Reed Teague "Image analysis via the general theory of moments" in J. Opt. Soc. Am., Vol. 70, No. 8, August 1980, pages 920-930, the contents of which are hereby incorporated by reference.

Figure 9:
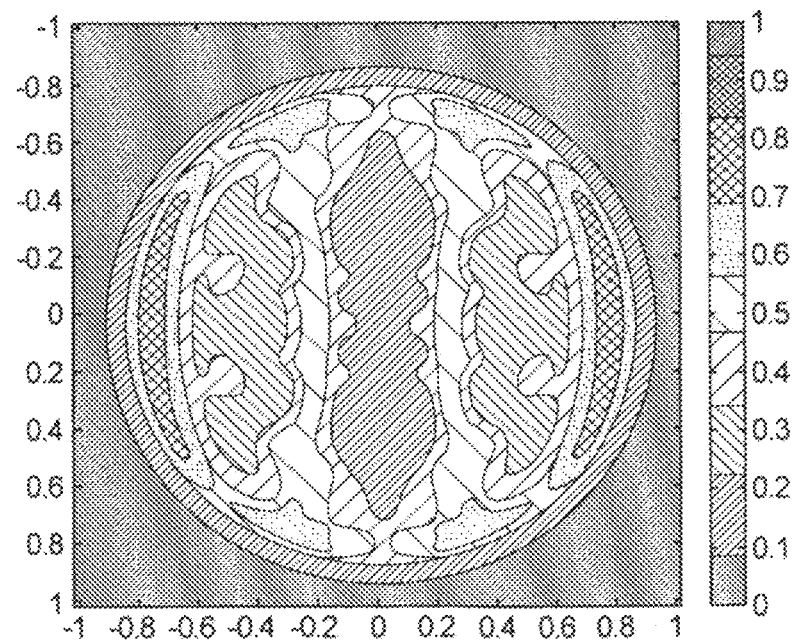
FIG. 9 depicts an exemplary reconstructed image of the image shown in FIG. 7 by use of a method in accordance with an embodiment of the invention.

By use of such moment functions it is found that approximately 20 numbers can define the image shown in FIG. 7, thus reducing the number of points which must be compared with a modeled image in the subsequent processing. An example of such a reconstructed image is shown in FIG. 9 which shows an image corresponding to that shown in FIG. 7, reconstructed using a $10^{th}$ order radial Chebyshev polynomial. It will be appreciated that the higher the order of the polynomial, the greater the resolution of the reconstructed image. Thus the choice of the order will be a compromise between the processing time and the desired resolution. It will also be appreciated that two orthogonal basis functions are used, corresponding to the two-dimensional nature of the image. There may be circumstances however, when a one-dimensional linear scan is imaged in which case a single basis function will be sufficient. Likewise there may be occasions when a three-dimensional image is obtained in which case three basis functions will be required.

The moment function is invariant to noise, rotation and translation such that the measurements will be immune to disturbances due to vibrations of the lithographic apparatus or scatterometry system. By processing two pupil images measured at different times but assuming that there have been no lithographic system parameter variations in the intervening period, it is possible to obtain an indication of the magnitude of any vibrations in the lithographic apparatus or the scatterometry system.

In a variation of the process described above, instead of the system identification being derived on the basis of a measured pupil plane derived by varying the relevant lithographic inputs on a project layer used in a product reticle in step S61, the pupil plane may be derived via simulations using scanning simulation software for the product GDS file to simulate how the structure will imaged on the substrate. Rigorous coupled wave analysis (RCWA) may be used to simulate the pupil plane of the scatterometer on a part of the image. In step S62, the simulated pupil plane image will then be represented by the moments.

Figure 10:
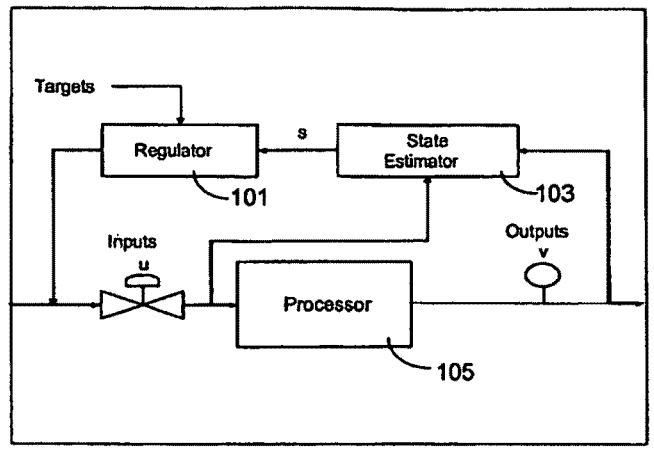
FIG. 10 depicts a model predictive control system used in a process in accordance with an embodiment of the invention.
Figure 11:
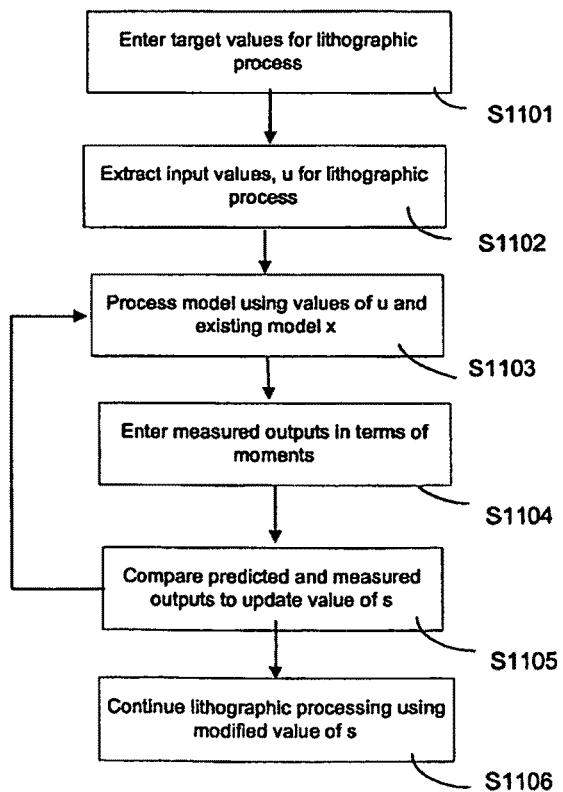
FIG. 11 depicts process steps performed by the model predictive system of FIG. 10, according to an embodiment of the invention.

Turning now to FIGS. 10 and 11, these figures depict the use of a model predictive control system in a method in accordance with an embodiment of the invention. The basis of the control system is a multi variant mathematical model s that describes the relationship between lithographic process inputs u to be manipulated and process outputs v. Process inputs u may include, for example, focus offsets, dose and overlay offsets. Process outputs v are observable quantities sensitive to changes in the system and may be measured by the scatterometer, such as overlay misalignment and critical dimensions. The measured and predicted output values will be expressed in terms of moments representative of a scatterometry image as discussed above.

The model predictive control system shown in FIG. 10 will perform the function of processor 55 shown in FIG. 5 and includes a regulator 101, a state estimator 103 and a processor 105. Referring now particularly to FIG. 11, in step S1101 regulator 101 receives target information relating to desired features on the substrates to be produced in the lithography process.

In step S1102, values of process inputs u are input into processor 105. The processor uses the generic functions f and g representing the characteristics of the lithography system to calculate the values $$\frac{ds}{dt} = f(s, u, t) \text{ and}$$

$$v = g(s)$$

where t is time. Thus the calculated value of v corresponds to predicted values of the outputs v, whilst changes with time in the lithographic process are monitored.

The values of u and v, both measured and predicted, are input into state estimator 103, which in step S1104, updates mathematical model s, by comparing and fitting the predicted outputs and measured outputs v.

In step S1105, regulator 101 then causes lithography controller 57 of FIG. 5 to continue processing with modified parameters corresponding to values produced with the modified model. The process continues in the loop indicated in FIG. 11 with further modified values of the model as the lithography process varies with time, to achieve the input target values. As indicated in FIG. 10, the output of processor 105 may also be used in further processing applications for the lithography system.

As discussed above, by using radially invariant moment functions calculated using basis functions such as Zernike, discrete Chebyshev, radial Chebyshev and Legendre polynomial, descriptors of the entire pupil plane image of the scatterometer can be obtained using relatively few points, thus reducing the processing required by state estimator 103.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of using a lithography system, the method comprising:
    projecting, using a projection system, a beam of radiation onto a target on a substrate;
    obtaining pupil plane images from the target on the substrate for a plurality of parameters of a lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;
    determining a magnitude of vibration in the lithographic apparatus based on at least two of the pupil plane images obtained at different times;
    calculating moment functions based on intensities of the pupil plane images, each of the moment functions being a representative of a corresponding one of the pupil plane images;

determining a lithographic system identification based on correlations between the moment functions and the plurality of parameters of the lithographic apparatus or features of the target; and adjusting, using a lithography controller, one or more parameters from among the plurality of parameters of the lithographic apparatus based on the lithographic system identification to control a lithographic process.

2. The method according to claim 1, wherein the obtaining of the pupil plane images comprises:

producing, using a scatterometer, the pupil plane images from radiation scattered from the target on the substrate.

3. The method according to claim 1, wherein the obtaining of the pupil plane images comprises:

simulating the pupil plane images based on radiation scattered from the target on the substrate.

4. The method according to claim 1, wherein:

each of the pupil plane images is a two-dimensional image; and the two-dimensional image corresponds to two orthogonal basis functions, each orthogonal basis function of the two orthogonal basis functions corresponding to a different respective direction in the two-dimensional image.

5. The method according to claim 1, further comprising:

obtaining the pupil plane images based on radiation scattered from the target at different times;

calculating coefficients of the moment functions based on orthogonal basis functions, each of the moment functions being a representative of the corresponding one of the pupil plane images;

determining correlations between each of the moment functions and a corresponding parameter from among the plurality of parameters of the lithographic apparatus or a corresponding feature of the features of the target; and determining the lithographic system identification based on the correlations.

6. A lithographic system comprising:

a lithographic apparatus comprising:
  an illumination optical system configured to illuminate a pattern, and
  a projection optical system configured to project an image of the pattern on to a substrate;

a measurement system configured to obtain pupil plane images from the pattern for a plurality of parameters of the lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;

a computational arrangement configured to:
  determine a magnitude of vibration in the lithographic apparatus based on at least two of the pupil plane images obtained at different times;
  calculate moment functions based on intensities of the pupil plane images, each of the moment functions being a representative of a corresponding one of the pupil plane images, and
  determine a lithographic system identification based on correlations between the moment functions and the plurality of parameters of the lithographic apparatus or features of the pattern; and a controller configured to adjust one or more parameters from among the plurality of parameters of the lithographic apparatus based on the lithographic system identification to control a lithographic process.

7. The lithographic system according to claim 6 wherein the measurement system comprises a scatterometer.

8. The lithographic system according to claim 6, wherein each of the pupil plane images is a simulated pupil plane image that corresponds to a simulation of the pattern based on radiation scattered from the pattern.

9. The lithographic system according to claim 6, wherein:

each of the pupil plane images is a two-dimensional image; and the two-dimensional image corresponds to two orthogonal basis functions, each orthogonal basis function of the two orthogonal basis functions corresponding to a different respective direction in the two-dimensional image.

10. A system comprising:

a measurement system configured to:
  direct a beam of radiation onto a target pattern on a substrate, and
  obtain pupil plane images based on radiation scattered from the target pattern for a plurality of input parameters of a lithographic apparatus, each of the pupil plane images corresponding to a respective input parameter of the plurality of input parameters of the lithographic apparatus, each input parameter of the plurality of input parameters of the lithographic apparatus being different from other input parameters of the plurality of input parameters of the lithographic apparatus; and a computational arrangement configured to:
  determine a magnitude of vibration in the lithographic apparatus based on at least two of the pupil plane images obtained at different times.
  calculate moment functions based on orthogonal basis functions, each of the moment functions being a representative of a corresponding one of the pupil plane images, and
  determine a lithographic system identification based on correlations between the moment functions and the plurality of input parameters of the lithographic apparatus or features of the target pattern; and a controller configured to adjust one or more input parameters from among, the plurality of input parameters of the lithographic apparatus based on the lithographic system identification to control a lithographic process.

11. A lithographic cell comprising:

a coater configured to coat substrates with a radiation sensitive layer;

a lithographic apparatus configured to expose images onto the radiation sensitive layer of substrates;

a developer configured to develop images exposed by the lithographic apparatus;

a measurement system configured to:
  obtain pupil plane images based on radiation scattered from a target pattern on a substrate for a plurality of parameters of the lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;

a computational arrangement configured to:

determine a magnitude of vibration in the lithographic apparatus based on at least two of the pupil plane images obtained at different times;

calculate moment functions based on orthogonal basis functions, each of the moment functions being a representative of a corresponding one of the pupil plane images, and determine a lithographic system identification based on correlations between the moment functions and the plurality of parameters of the lithographic apparatus or features of the target pattern; and a controller configured to adjust one or more parameters from among the plurality of parameters of the lithographic apparatus based on the lithographic system identification to control a lithographic process.

12. A device manufacturing method comprising:

forming, using a lithographic apparatus, a pattern on a substrate;

obtaining pupil plane images based on radiation scattered from the pattern for a plurality of parameters of the lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;

determining a magnitude of vibration in the lithographic apparatus based on at least two of the pupil plane images obtained at different times;

calculating moment functions based on orthogonal basis functions, each of the moment functions being a representative of a corresponding one of the pupil plane images;

determining a lithographic system identification based on correlations between the moment functions and the plurality of parameters of the lithographic apparatus or features of the pattern; and adjusting, using a lithography controller, one or more parameters from among the plurality of parameters of the lithographic apparatus based on the lithographic system identification to control a lithographic process.

13. A method comprising:

obtaining pupil plane images from a target on a substrate for a plurality of parameters of a lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;

determining a magnitude of vibration in the lithographic apparatus based on at least two of the pupil plane images obtained at different time calculating moment functions based on orthogonal basis functions, each of the moment functions being a representative of a corresponding one of the pupil plane images;

determining a lithographic system identification based on correlations between the moment functions and the plurality of parameters of the lithographic apparatus or features of the target; and adjusting, using a controller, one or more parameters from among the plurality of parameters of the lithographic apparatus based on the lithographic system identification to control a lithographic process.

14. The method according to claim 13, wherein the obtaining of the pupil plane images comprises:

producing, using a scatterometer, the pupil plane images from radiation scattered from the target on the substrate.

15. The method according to claim 13, wherein the obtaining of the pupil plane images comprises:

simulating the pupil plane images based on radiation scattered from the target on the substrate.

16. The method according to claim 13, wherein:

each of the pupil plane images is a two-dimensional image; and the two-dimensional image corresponds to two orthogonal basis functions, each orthogonal basis function of the two orthogonal basis functions corresponding to a different respective direction in the two-dimensional image.

17. The method according to claim 13, comprising:

obtaining the pupil plane images based on radiation scattered from the target at different times;

calculating coefficients of the moment functions based on the orthogonal basis functions, each of the moment functions being a representative of the corresponding one of the pupil plane images;

determining correlations between each of the moment functions and a corresponding parameter from among the plurality of parameters of the lithographic apparatus or a corresponding feature of the features of the target; and determining the lithographic system identification based on the correlations.

18. A non-transitory computer readable medium having stored thereon computer executable instructions, execution of which by a computing device causes the computing device to perform operations comprising:

obtaining pupil plane images based on radiation scattered from a target on a substrate for a plurality of parameters of a lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;

determining a magnitude of vibration in the lithographic apparatus based on at least two of the pupil plane images obtained at different times;

calculating moment functions based on orthogonal basis functions, each of the moment functions being a representative of a corresponding one of the pupil plane images;

determining a lithographic system identification based on correlations between the moment functions and the plurality of parameters of the lithographic apparatus or features of the target; and adjusting, using a controller, one or more parameters from among the plurality of parameters of the lithographic apparatus based on the lithographic system identification to control a lithographic process.

19. A lithographic system comprising:

a measurement system configured to obtain pupil plane images based on radiation scattered from a pattern on a substrate for a plurality of parameters of a lithographic apparatus, each of the pupil plane images corresponding to a respective parameter of the plurality of parameters of the lithographic apparatus, each parameter of the plurality of parameters of the lithographic apparatus being different from other parameters of the plurality of parameters of the lithographic apparatus;
a computational arrangement configured to:
determine a magnitude of vibration in the lithographic apparatus based on at least two of the pupil plane images obtained at different times;
calculate moment functions based on orthogonal basis functions, each of the moment functions being a representative of a corresponding one of the pupil plane images, and
determine a lithographic system identification based on correlations between the moment functions and the plurality of parameters of the lithographic apparatus or features of the pattern; and
a controller configured to adjust one or more parameters from among the plurality of parameters of the lithographic apparatus based on the lithographic system identification to control a lithographic process.

20. The lithographic system according to claim 19, wherein the measurement system comprises a scatterometer.

21. The lithographic system according to claim 19, wherein each of the pupil plane images is a simulated pupil plane image that corresponds to a simulation of the pattern based on the radiation scattered from the pattern.

22. The lithographic system according to claim 19, wherein:
each of the pupil plane images is a two-dimensional image; and
the two-dimensional image corresponds to two orthogonal basis functions, each orthogonal basis function of the two orthogonal basis functions corresponding to a different respective direction in the two-dimensional image.

23. The lithographic system according to claim 19, further comprising:
an illumination optical system configured to illuminate the pattern; and
a projection optical system configured to project an image of the pattern on to the substrate.

* * * * *